(12) United States Patent
Iacovangelo et al.

(10) Patent No.: US 8,247,080 B2
(45) Date of Patent: Aug. 21, 2012

(54) COATING STRUCTURE AND METHOD

(75) Inventors: Charles Dominic Iacovangelo, Clifton Park, NY (US); Victor Lienkong Lou, Schenectady, NY (US)

(73) Assignee: Momentive Performance Materials Inc., Albany, NY (US)

( * ) Notice: Subject to any disclaimer, the term of this patent is extended or adjusted under 35 U.S.C. 154(b) by 2123 days.

(21) Appl. No.: 11/249,085

(22) Filed: Oct. 12, 2005

(65) Prior Publication Data

US 2006/0051602 A1 Mar. 9, 2006

Related U.S. Application Data

(63) Continuation-in-part of application No. 11/175,236, filed on Jul. 6, 2005.

(60) Provisional application No. 60/586,059, filed on Jul. 7, 2004.

(51) Int. Cl.
*B32B 15/04* (2006.01)
*B32B 9/00* (2006.01)
*B32B 19/00* (2006.01)
*C23C 16/00* (2006.01)
*B05D 1/36* (2006.01)

(52) U.S. Cl. ............... 428/472; 428/698; 427/248.1; 427/402; 118/720

(58) Field of Classification Search .......... 118/720; 427/248.1, 702; 428/472, 698

See application file for complete search history.

(56) References Cited

U.S. PATENT DOCUMENTS

| | | | | |
|---|---|---|---|---|
| 3,278,319 A | * | 10/1966 | Cohen | 501/13 |
| 4,374,903 A | * | 2/1983 | Intrater et al. | 428/627 |
| 4,980,730 A | * | 12/1990 | Mishima et al. | 257/98 |
| 5,350,720 A | * | 9/1994 | Kawada et al. | 501/97.1 |
| 5,508,092 A | * | 4/1996 | Kimock et al. | 428/216 |
| 5,536,360 A | * | 7/1996 | Nguyen et al. | 216/96 |
| 5,914,189 A | | 6/1999 | Hasz et al. | |

(Continued)

FOREIGN PATENT DOCUMENTS

JP 62123094 6/1987

(Continued)

OTHER PUBLICATIONS

Machine Translation of JP 06-061335 (1994).*

(Continued)

*Primary Examiner* — Gerard Higgins
*Assistant Examiner* — Sathavaram I Reddy
(74) *Attorney, Agent, or Firm* — Joseph R. Waters

(57) ABSTRACT

A coating structure including an outer coating comprising aluminum; and an interlayer disposed between a substrate and the outer coating is provided. The interlayer may include a rare earth metal, a transition metal, or a noble metal. The interlayer may have one or more property of being less responsive to halogen etching relative to the outer coating; having a coefficient of thermal expansion that is greater than the coefficient of thermal expansion of the substrate and less than the coefficient of thermal expansion of the outer coating or vice versa; having a color different from the color of the outer coating; having a electrical conductivity different from the electrical conductivity of the outer coating. A method of making is article is provided. The method may include securing an interlayer to a substrate surface, and securing an outer coating to a surface of the interlayer opposite the substrate.

19 Claims, 2 Drawing Sheets

U.S. PATENT DOCUMENTS

| | | | |
|---|---|---|---|
| 6,132,843 A * | 10/2000 | Kuroda et al. | 428/141 |
| 6,139,983 A | 10/2000 | Ohashi et al. | |
| 6,187,453 B1 | 2/2001 | Maloney | |
| 6,242,719 B1 | 6/2001 | Kano et al. | |
| 6,410,172 B1 * | 6/2002 | Gilbert, Sr. | 428/698 |
| 6,416,889 B2 | 7/2002 | Aihara et al. | |
| 6,558,806 B2 | 5/2003 | Watanabe | |
| 6,627,323 B2 | 9/2003 | Nagaraj et al. | |
| 6,641,941 B2 | 11/2003 | Yamada et al. | |
| 6,858,332 B2 | 2/2005 | Yamada | |
| 2004/0009649 A1 * | 1/2004 | Kub et al. | 438/459 |
| 2004/0126612 A1 | 7/2004 | Shinkai et al. | |

FOREIGN PATENT DOCUMENTS

| | | |
|---|---|---|
| JP | 5238855 | 9/1993 |
| JP | 5238859 | 9/1993 |
| JP | 06061335 | 3/1994 |

OTHER PUBLICATIONS

PH Townsend et al., "Elastic Relationships in Layered Composite Media With Approximation for the Case of Thin Films on a Thick Substrate", J. Appl. Phys., vol. 62, (11), pp. 4438-4444, Dec. 1, 1987.

William D. Nix et al., "Mechanical Properties of Thin Films", Metallurigal Transactions A, vol. 20A, pp. 2217-2245, Nov. 1989.

* cited by examiner

COATING STRUCTURE AND METHOD

BACKGROUND

The invention includes embodiments that may relate to a coating structure. The invention includes embodiments that may relate to a method of depositing the coating structure.

In wafer production, halogen-based corrosive gases or plasma may be used for purposes of deposition, etching, and cleaning. These gases or plasma may attack the components of the coating equipment and may cause erosion. This erosion may limit the life of the components and of the equipment.

It may be desirable to extend the service life of components and equipment exposed to corrosive atmosphere.

BRIEF DESCRIPTION

In one embodiment in accordance with the invention, a coating structure may include an outer coating comprising aluminum and an interlayer disposed between a substrate and the outer coating. The interlayer may include a rare earth metal, a transition metal, or a noble metal.

According to another embodiment, an article may include a substrate; an outer coating; and, an interlayer securing the outer coating to the substrate. The interlayer may have one or more property of being less responsive to fluorine etching relative to the outer coating; having a coefficient of thermal expansion that is greater than a coefficient of thermal expansion of the substrate and less than a coefficient of thermal expansion of the outer coating or vice versa; having a color that is different from a color of the outer coating to enable detection that the article is ready for recoat; having a electrical conductivity that differs from a electrical conductivity of the outer coating to enable detection that the article is ready for recoat and being able to extend the article life by, for example, protecting the substrate from halogen gas penetration.

In one embodiment, a method may include securing an interlayer to a substrate surface, and securing an outer coating to a surface of the interlayer opposite the substrate. The interlayer may include a rare earth metal, a transition metal, or a noble metal. The outer coating may include aluminum.

DETAILED DESCRIPTION

Figure 1:
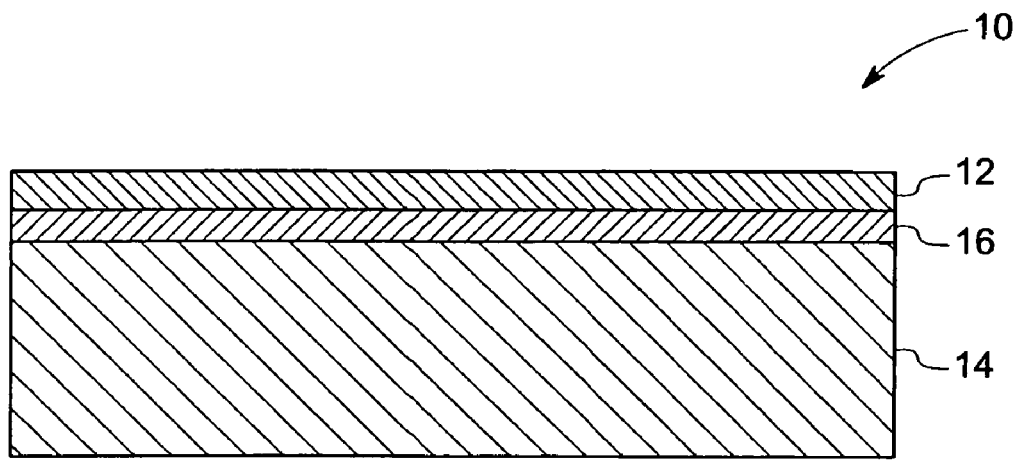
FIG. 1 is a schematic drawing of an article according to one embodiment of the invention.

The invention includes embodiments that may relate to a coating structure. The invention includes embodiments that may relate to a method of depositing the coating structure.

As used herein, approximating language may be applied to modify any quantitative representation that may vary without resulting in a change in the basic function to which it is related. Accordingly, a value modified by a term or terms, such as "about" and "substantially," may not to be limited to the precise value specified, in some cases. In at least some instances, the approximating language may correspond to the precision of an instrument for measuring the value. Similarly, "free" may be used in combination with a term, and may include an insubstantial number, or trace amounts, while still being considered free of the modified term. As used herein, "substrate" may be used interchangeably with "substrates", "surface" may be used interchangeably used with "surfaces." As used herein, a plasma-resistant coating is a coating that resists penetration of halogen-based gases or plasmas.

The coating structure may include an interlayer, and an outer coating disposed over the interlayer. The coating structure may include one or more layers between the substrate and the interlayer, and/or between the interlayer and the outer coating.

An outer coating may include an electrically insulating ceramic possessing a relatively high thermal conductivity. The outer coating may include at least one of aluminum nitride (AlN), aluminum oxynitride (AlON), aluminium oxide ($Al_2O_3$), or a combination of two or more of these. In one embodiment, the outer coating may be a single layer of AlN, AlON, or $Al_2O_3$. In another embodiment, the outer coating may be a multi-layer of the same material, or multiple layers of different materials.

In some embodiments, the outer coating may be a plasma-resistant coating. With respect to specific plasma chemistry, the selected outer coating may be amorphous, crystalline, or engineered to be a mixture of both amorphous and crystalline phases. The thickness of the outer coating may be selected with reference to the end-use application. In one embodiment, the outer coating may be thin enough to provide desired thermal contact between the substate and a workpiece that may be in contact with the outer coating, and thick enough to provide good life span for the coating. In some embodiments, the outer coating may have a thickness greater than about 10 Angstroms. In one embodiment, the thickness may be in a range of from up to about 1 micrometer to about 5 micrometers, from about 5 micrometers to about 10 micrometers, from about 10 micrometers to about 50 micrometers, from about 50 micrometers to about 75 micrometers, or the thickness may be greater than about 75 micrometers.

A suitable substrate may include one or more of a metal nitride, a metal carbide, a metal boride, or a metal oxide. The metal nitride may be boron nitride. The boron nitride may be carbon doped. In an exemplary embodiment, the metal nitride may be pyrolitic boron nitride. The metal nitride may include one or more of tantalum, titanium, tungsten, zirconium, hafnium, lanthanum, vanadium, niobium, magnesium, chromium, molybdenum, or beryllium. The metal nitride may include silicon nitride. The metal carbide may include one or more of silicon, tantalum, titanium, tungsten, zirconium, hafnium, lanthanum, vanadium, niobium, magnesium, chromium, molybdenum, or beryllium. The metal boride may may include one or more of silicon, tantalum, titanium, tungsten, zirconium, hafnium, lanthanum, vanadium, niobium, magnesium, chromium, molybdenum, or beryllium. The metal oxide may may include one or more of silicon, tantalum, titanium, tungsten, zirconium, hafnium, lanthanum, vanadium, niobium, magnesium, chromium, molybdenum, or beryllium. In one embodiment, the substrate may include one or more of silicon nitride, silicon carbide, or quartz. In one embodiment the substrate may include two or more of the above compounds.

The substrate shape and size may depend on the particular end-use application. The substrate may include a single layer, or may include multiple layers. The multiple layers may be formed from either same material, or from different materials from layer to layer. The different layers, for example, may have differing electrical and thermal properties.

The interlayer may include one or more metals. Particularly, the interlayer may include one or more of a rare earth metal, a transition metal, or a noble metal. Suitable rare earth metals may include one or more of cerium or gadolinium. In one embodiments, the interlayer may include one or more rare earth metal oxides. Suitable rare earth metal oxides may include one or more of cerium oxide ($CeO_2$), gadolonium oxide ($Gd_2O_3$), or the like. In one embodiment, the rare earth metal oxides may include only a single one of cerium oxide ($CeO_2$), gadolonium oxide ($Gd_2O_3$), or the like.

In one embodiments, the interlayer may include one or more transition metal oxides. Suitable transition metal oxides may include one or more of yttrium oxide ($Y_2O_3$), hafnium oxide ($HfO_2$), or the like. In one embodiment, the transition metal oxides may include only a single one of yttrium oxide ($Y_2O_3$), hafnium oxide ($HfO_2$), or the like.

In one embodiment, the interlayer may include one or more noble metals. Suitable noble metals may be platinum, rhodium, rhenium, or palladium. In one embodiment, the interlayer may include gold. In another embodiment, the interlayer may include only a single noble metal.

The interlayer may include a single layer, or may include multiple layers. The multiple layers may be formed from either the same material, or from different materials from layer to layer. In one embodiment, the interlayer, the outer coating, or both the interlayer and the outer coating are halogen free regardless of whether a rare earth metal oxide, a transition metal oxide, or both, are present. In one embodiment, the interlayer, the outer coating, or both the interlayer and the outer coating are fluorine free.

In one embodiment, the interlayer may be an etch-resistant coating. Material selection may be made with respect to specific etchants such that the interlayer material may be amorphous, crystalline, or engineered to be a mixture of both amorphous and crystalline phases. In one embodiment, the interlayer may include a compact of rare earth metal oxide powder or a transition metal oxide powder in the form of a sheet or layer. In one embodiment, the interlayer may include a thin film of a rare earth oxide, a transition metal oxide, or a noble metal. In embodiments where the interlayer includes a compacted layer of rare earth oxide or transition metal oxide powder, the powder may be compacted by hot isostatic pressing. Hot isostatic pressing may a yield high density and porous free interlayer. In embodiments where the interlayer is a thin film coating of rare earth oxide, a transition metal oxide, or a noble metal, the interlayer may be a continuous coating. In one embodiment, the interlayer may be microcrack free. Microcrack free may mean that no cracks are observable using optical microscopy or SEM with 10k magnification. Cracks include holes, perforations, pores, or lines.

In embodiments where the interlayer is a thin film coating or layer of rare earth oxide, a transition metal oxide, or a noble metal, the interlayer may be deposited by physical vapor deposition, chemical vapor deposition, or a solution based method—such as a sol gel technique. Chemical vapor deposition may enable a relatively higher loading of metal oxide within the interlayer.

The interlayer may include a silicate glass. A suitable silicate glass may be a calicium-silicate glass, a barium-silicate glass, or an alumino-silicate glass. The silicate glass may include a rare earth metal or a transition metal. In some embodiments, the silicate glass may include one or more rare earth metal oxides or transition metal oxides. The silicate glass may include a rare earth oxide, or a transition metal oxide, in an amount less than 10 weight percent, in a range of from about 10 weight percent to about 20 weight percent, from about 20 weight percent to about 30 weight percent, from about 30 weight percent to about 40 weight percent, from about 40 weight percent to about 50 weight percent, from about 50 weight percent to about 60 weight percent, or greater than about 60 weight percent based on the total weight of the glass. In one embodiment, the silicate glass may be halogen-free.

The thickness of the interlayer may be selected with reference to the end-use application. In one embodiment, the interlayer may have an average thickness in a range of less than about 1 micrometer. In one embodiment, the interlayer may have an average thickness in a range of greater than 50 angstroms. In one embodiment, the interlayer may have an average thickness in a range of from about 50 nanometers to about 100 nanometers, from about 100 nanometers to about 500 nanometers, from about 500 nanometers to about 1 micrometer, from about 1 micrometer to about 5 micrometers, from about 5 micrometers to about 10 micrometers, or greater than about 10 micrometers.

The interlayer may have one or more property of: being less responsive to halogen etching relative to the outer coating; having a coefficient of thermal expansion that is greater than the coefficient of thermal expansion of the substrate and less than the coefficient of thermal expansion of the outer coating or vice versa; having a color different from a color of the outer coating to enable detection that the article is ready for recoat; having a electrical conductivity different from a electrical conductivity of the outer coating to enable detection that the article is ready for recoat, or being able to extend article life and protecting the substrate from halogen gas penetration.

In one embodiment, an article including the coating structure may be useful in a semiconductor manufacturing environment. Such an environment may contain one or more of ammonia, hydrogen, or a halogen; and, may be at an elevated temperature. These coated articles may be used as, for example, electrostatic chucks; heater elements during the manufacture of integrated circuits, semiconductors, silicon wafers, chemical compound semiconductor wafers, or liquid crystalline display devices and their glass substrates; chemical polishing chambers; or the like.

In some embodiments, the interlayer may be etch-resistant, or may have a low-etch rate in a corrosive environment. The etch-resistant property of the interlayer may prevent or reduce penetration of deleterious gases or ions that may affect the substrate and may prevent substrate wear. In one embodiment, the etch rate for the interlayer may be lower than etch rate of the outer coating. The etch rate of the outer coating may be less than the etch rate for the substrate. Low etch rate of the coating structure may provide protection for the substrate. Such protection may extend the life of the article. The life cycle may be the amount of time that the article can be subjected to a working environment before it has to be replaced, for example as a result of the etching away of the protective coating.

A corrosive environment may include one or more etchants, such as halogen-containing etchants. The etchants may include, for example, nitrogen trifluoride ($NF_3$) or carbon tetrafluoride ($CF_4$). Such an environment may be associated with one or more of plasma etching, reactive ion etching, plasma cleaning, or gas cleaning. Examples of working environments may include halogen-based plasmas, halogen-based radicals generated from a remote plasma source, halogen-based species decomposed by heating, halogen-based gases, oxygen plasmas, oxygen-based plasmas, or the like. Examples of halogen-based plasma include a nitrogen trifluoride ($NF_3$) plasma, or fluorinated hydrocarbon plasma (e.g. carbon tetrafluoride ($CF_4$)), and may be used either alone or in combination with oxygen. The working environment may be a reactive ion etching environment.

In one embodiment, the interlayer may have an etch rate of less than 100 Angstroms per minute, in a range of from about 100 Angstroms per minute to about 75 Angstroms per minute, from about 75 Angstroms per minute to about 50 Angstroms per minute, from about 50 Angstroms per minute to about 25 Angstroms per minute, from about 25 Angstroms per minute to about 15 Angstroms per minute, from about 15 Angstroms per minute to about 10 Angstroms per minute, from about 10 Angstroms per minute to about 5 Angstroms per minute, from about 5 Angstroms per minute to about 2 Angstroms per minute, from about 2 Angstroms per minute to about 1 Angstrom per minute, from about 1 Angstrom per minute to about 0.5 Angstroms per minute, from about 0.5 Angstrom per minute to about 0.1 Angstroms per minute or less than about 0.1 Angstroms per minute. In one embodiment, at a temperature that is greater than room temperature the rate of etching may be less than about 10 Angstroms/minute. In one embodiment, the etch rate of the interlayer may be greater than about 1 percent, in a range of from about 1 percent to about 5 percent, from about 5 percent to about 10 percent, from about 10 percent to about 25 percent, from about 25 percent to about 50 percent higher, or greater than about 50 percent higher relative to the etch rate of the outer coating.

When applied to a substrate, the coating structure according to one embodiment of the invention may increase the life cycle of the article. The increase may be by a period greater than about 100 hours relative to an article that has a coated substrate without an interlayer. In one embodiment, the coating structure may increase the life cycle of the article by a time period in a range of from up to about 500 hours to about 1000 hours, from about 1000 hours to about 1500 hours, from about 1500 hours to about 2000 hours, or greater than about 2000 hours of service life. Service life may include the actual working life.

The interlayer may reduce thermal expansion stresses that may form between the substrate and the outer coating during thermal cycling. In one embodiment, the interlayer may have a coefficient of thermal expansion that is greater than the coefficient of thermal expansion of the substrate and that is less than the coefficient of thermal expansion of the outer coating. In one embodiment, the interlayer may have a coefficient of thermal expansion that is less than the coefficient of thermal expansion of the substrate and that is greater than the coefficient of thermal expansion of the outer coating. The coefficient of thermal expansion of the interlayer may depend on the composition of the interlayer. In one embodiment, the coefficient of thermal expansion of the interlayer may be within 1 percent of the coefficient of thermal expansion of the outer coating, or may be within 1 percent of the coefficient of thermal expansion of the substrate. In one embodiment, the coefficient of thermal expansion of the interlayer may differ by about 1 percent, in a range of from about 1 percent to about 5 percent, from about 5 percent to about 10 percent, from about 10 percent to about 15 percent, from about 15 percent to about 25 percent, from about 25 percent to about 50 percent, differ by about 50 percent of the coefficient of thermal expansion of the outer coating. In one embodiment, the coefficient of thermal expansion of the interlayer may differ by about 1 percent, in a range of from about 1 percent to about 5 percent, from about 5 percent to about 10 percent, from about 10 percent to about 15 percent, from about 15 percent to about 25 percent, from about 25 percent to about 50 percent, or differ by about 50 percent of the coefficient of thermal expansion of the substrate.

The choice of the composition of the interlayer may depend on the composition of the substrate, the composition of the outer coating, and the particular end-use application of the coated article. Suitable matching of the coefficient of thermal expansion of the interlayer, the substrate and/or the outer coating may reduce or prevent the cracking of the outer protective coating, and/or may reduce or prevent the peeling of the outer protective coating. Particularly, selection of materials may allow for matching of the interlayer CTE to be, in one embodiment, relatively similar to the CTE of the outer coating, or in another embodiment, relatively similar to the CTE of the substrate. In one embodiment, the interlayer CTE is selected to be about half of the difference of the CTE of the substrate relative to the outer coating. In one embodiment, the CTE of the substrate is greater than the CTE of the interlayer, which is greater than the CTE of the outer coating. This arrangement may create a gradual lowering of the CTE in an outward direction from the substrate.

In one embodiment, the coefficient of thermal expansion of the interlayer silicate glass may be less than about 0.5 parts per million per degree centigrade (ppm/° C.). In one embodiment, the coefficient of thermal expansion of the interlayer silicate glass may be in the range of about 0.5 parts per million per degree centigrade to about 1 parts per million per degree centigrade, from about 1 parts per million per degree centigrade to about 2 parts per million per degree centigrade, from about 2 parts per million per degree centigrade to about 5 parts per million per degree centigrade, from about 5 parts per million per degree centigrade to about 7 parts per million per degree centigrade, or the coefficient of thermal expansion of the interlayer silicate glass may be greater than than about 7 parts per million per degree centigrade.

In one embodiment, the interlayer may have a residual stress value that is greater than or equal to about 10 MPa. In another embodiment, the residual stress may be greater than about 100 MPa (compressive) or greater than about 200 MPa (compressive).

The interlayer may have a relatively increased adhesive strength to one or both of the substrate or the outer coating compared to an adhesive strength of the outer coating directly to a surface of the substrate. Increased adhesion may reduce peeling of the outer coating. Adhesion is the bonding of two different materials at an interface, and cohesion refers to the property of a mass that resists separation. In one embodiment, the increased adhesive strength of the interlayer means that the adhesive strength of the interlayer exceeds the cohesive strength of layer, coating, or substrate to which the interlayer may be adhered.

Use of a compliant material such as a noble metal as a interlayer may facilitate deposition of one or more outer coatings that is thicker than might otherwise be possible.

The interlayer may have a color that is different from the color of the outer coating. This may enable detection that the article is ready for recoat. When sufficient thickness of the outer coating has been removed, for example, by etching or abrasion the contrasting color of the interlayer may show through. A visual observation of the article may allow for detection that the article is sufficiently worn and ready for recoat or replacement.

The interlayer may have an electrical conductivity different from the electrical conductivity of the outer coating. The conductivity differential may enable detection that the article is ready for recoat or replacement. When sufficient thickness of the outer coating has been removed, for example, by etching or abrasion, the electrical conductivity of the surface may be more like the electrical conductivity of the interlayer, rather than the electrical conductivity of the outer coating. The change and/or difference may be measurable or at least detectable. This conductivity difference may signal that the article is ready for recoat or replacement.

In one exemplary embodiment, the coating structure may include an aluminum nitride outer coating. An interlayer may be disposed between a pyrolitic boron nitride substrate and the aluminum nitride outer coating. The interlayer may include a rare earth metal oxide.

FIG. 1 is a schematic drawing of an article 10 according to one embodiment of the invention. The article 10 may include an outer coating 12 disposed on a substrate 14, and an interlayer 16 disposed between the outercoating 12 and the substate 14.

Figure 2:
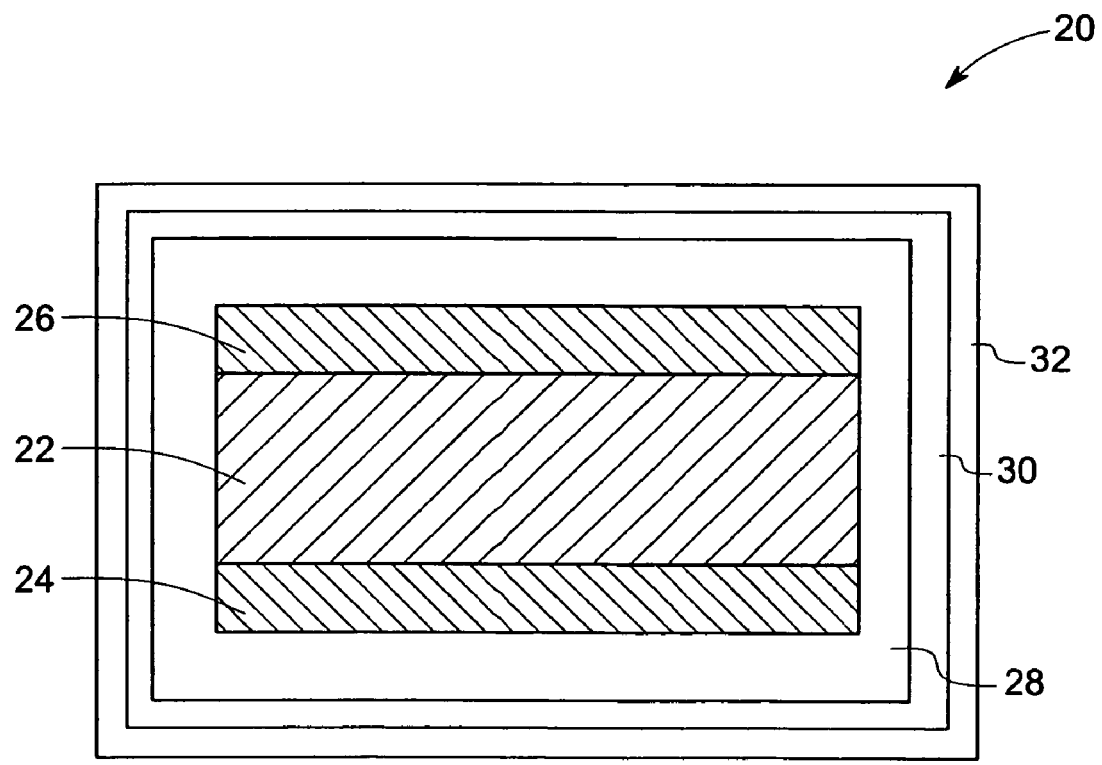
FIG. 2 is a schematic drawing of an electrostatic chuck according to one embodiment of the invention.

FIG. 2 is a schematic drawing that illustrates an electrostatic chuck 20. The electrostatic chuck 20 may include a supporting substrate 22, a heat-generating layer 24, a plurality of electrodes 26, an insulating layer 28, an interlayer 30, and an outer coating 32.

The insulating layer 28 is disposed on a surface of the substrate 22. The supporting substrate 22 may be thermally insulating and may include, for example, boron nitride-coated graphite. The insulating layer 28 may be pyrolitic boron nitride.

The heat generating layer 24 and the electrodes 26 may have portions that are electrically conducting. The electrodes may handle relatively high voltages at frequencies useful for, for example, electrostatic chucking. Heater elements (not shown) in the form of electrically conductive layers may be embedded within insulating protective coatings. Thus, passing electrical current through the conductive layers may provide heat. It may be desirable to indirectly heat a graphite susceptor. In an electrostatic chuck, the electrically conductive layers may support or hold a single crystal wafer, or an equivalent substrate by a electrostatic force. In one embodiment, the electrically conductive layers may be used as "wafer support" (or as a wafer processing platform) for supporting and holding a single crystal wafer or a substrate by electrostatic force as well as for heating such a wafer or substrate. These articles may be used in mechanical milling or ion beam etching.

The electrostatic chuck may be used during wafer processing. Wafer processing may include, for example, depositing or removing one or more layers from the wafer. During use, the outer coating may be exposed to an etchant. The etchant may include a halogen gas. Such exposure, for example, may remove less than about 1 micrometer of material from the exposed surface of the outer coating during a life cycle. The coating structure may protect an article during its use in the wafer processing system.

Figure 3:
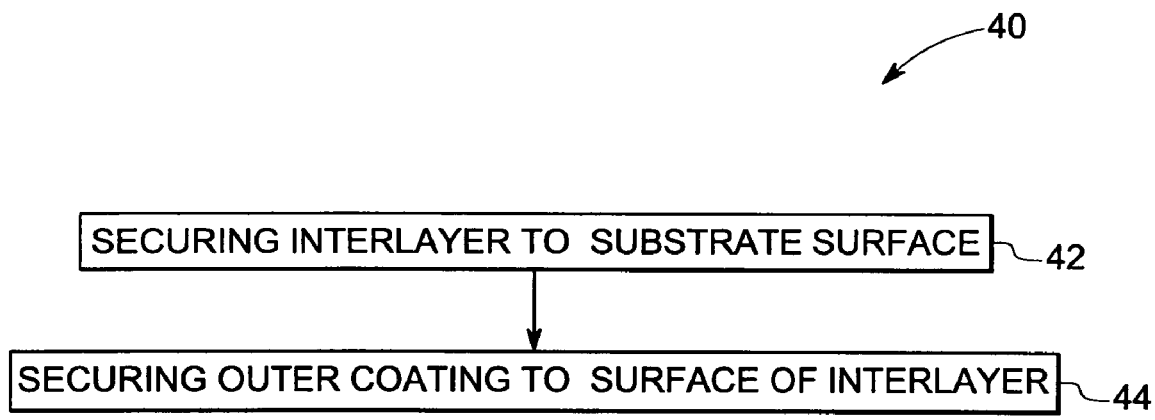
FIG. 3 is a flow chart illustrating a method of making an article according to one embodiment of the invention.

With reference to FIG. 3, a method 40 may include: securing an interlayer to a substrate surface (step 42), and, securing an outer coating to a surface of the interlayer opposite the substrate (step 44). Securing may include one or more of sputtering, electron beam evaporation, chemical vapor deposition, plasma assisted chemical vapor deposition, expanding thermal plasma chemical vapor deposition, ion plating, metal organic chemical vapor deposition (MOCVD), metal organic vapor phase epitaxy (MOVPE), plasma spray, pouring of molten material, sol-gel processing, and the like.

As discussed hereinabove, the article may be configured as, for example, a heater, a electrostatic chuck, a shutter ring, a flange, a drill, a window, or the like. In one embodiment, the article may be a drill and the method may further include drilling a work piece. In one embodiment, the article may be a heater and the method may further include heating a work piece.

EXAMPLES

The following examples are intended only to illustrate methods and embodiments in accordance with the invention, and as such should not be construed as imposing limitations upon the claims. Unless specified otherwise, all ingredients are commercially available from such common chemical suppliers as Alpha Aesar, Inc. Ward Hill, Mass.), Sigma-Aldrich Corp. (St. Louis, Mo.), and the like.

Example 1

Etch Rate Measurements of Glass Samples

Five samples are prepared from alumino-silicate glasses with differing concentrations of rare earth metal oxides/transition metal oxide. A stoichiometric amount of aluminum oxide, silicon oxide, and rare earth oxide/transition metal oxide are fused into a layer. No top coat is provided to allow testing of the interlayer etch rate.

The etch rate of the samples is measured after fluorine reactive ion etching. Table 1 shows the etch rate of Samples 1-5 as measured by gravimetry. Gravimetry involves measuring the weight change of the samples after fluorine reactive ion etching and considering the sample density and surface area. Fluorine reactive ion etching was carried out with $NF_3$/Ar ratio of 16/34 standard cubic centimeters per minute (sccm), chamber pressure of 100 mTorr, at 400 watts for 300 minutes.

TABLE 1

Etch rate of Samples 1-5

| Sample | Composition (wt %) | | | | | Etch rate (Å/min) |
| --- | --- | --- | --- | --- | --- | --- |
| | $Al_2O_3$ | $SiO_2$ | $Y_2O_3$ | $CeO_2$ | $Gd_2O_3$ | |
| 1 | 20.1 | 35.4 | 44.5 | — | — | 2.6 |
| 2 | 15.8 | 27.9 | — | — | 56.3 | 0.9 |
| 3 | 32.5 | 45.9 | 21.6 | — | — | 0.8 |
| 4 | 29.2 | 41.2 | — | 29.6 | — | 7.6 |
| 5 | 28.8 | 40.6 | — | — | 30.6 | 1.7 |

Example 2

Etch Rate Measurements of Rare-Earth Oxide and Transition Metal Oxide Bulk Samples Samples 6-10 include metal oxide pellets. The metal oxide pellets are prepared by compacting and sintering of the indicated metal oxide powders. Fluorine reactive ion etching was carried out with $NF_3$/Ar ratio of 16/34 standard cubic centimeter per minute (sccm), chamber pressure of 100 mTorr, at 400 watts for 300 minutes.

The etch rate of Samples 6-10 is measured after fluorine reactive ion etching. Table 2 shows the etch rate of bulk samples 6-10 as measured by gravimetry. Gravimetry involves measuring the weight change of the samples after fluorine reactive ion etching and considering the sample density and surface area.

TABLE 2

Etch rate of bulk samples

| Sample | Composition | Etch rate (Å/min) |
| --- | --- | --- |
| 6 | $Y_2O_3$ | 0.0 ± 0.4 |
| 7 | $Al_2O_3$ | 3.1 ± 0.4 |
| 8 | $HfO_2$ | 9.1 ± 0.2 |
| 9 | $CeO_2$ | −0.3 ± 0.3 |
| 10 | $Gd_2O_3$ | −0.6 ± 0.3 |

Example 3

Etch Rate Measurements of Metal Oxide Coatings

Metal oxide coatings are prepared on clean substrates of quartz by sputtering. The conditions of the preparation include the sputtering environment, the flow rate, and the power requirements. The sputtering is carried out in 7% oxygen (balance argon) at 10 microns pressure and 65 cubic centimeters per minute flow rate. Radiofrequency power is 400 watts and 950 volts.

The thickness of the resulting coating is 350 nanometers plus or minus 150 nanometers. Once prepared, Samples 11-13 are etched. Fluorine reactive ion etching is carried out with $NF_3$/Ar ratio of 16/34 standard cubic centimeter per minute (sccm), and a chamber pressure of 100 mTorr at 400 watts for 300 minutes.

The etch rate is determined by profilometry comparison. Profilometry involves providing a shallow mask on the sample. The height of the step is measured before fluorine reactive ion etching, and again afterward. The height differential is calculated, and if necessary averaged. Table 3 shows the etch rate of coating samples 11-13.

TABLE 3

Etch rate of coating samples 11-13

| Sample | Composition | Etch rate (Å/min) |
|---|---|---|
| 11 | $Y_2O_3$ | 1.3 |
| 12 | $Al_2O_3$ | 6.7 |
| 13 | $CeO_2$ | 1.8 |

Example 4

Coefficient of Thermal Expansion Measurements

Five samples (14-18) are prepared in the same manner as Samples 1-5 in Example 1, respectively. These samples are tested to determine the coefficient of thermal expansion.

Table 4 shows the coefficient of thermal expansion of Samples 14-18. Coefficient of thermal expansion of the samples is determined by measuring the linear expansion of the samples 14-18 from room temperature to 600 degrees Celsius. The testing is performed using a commercially available (TMA) thermo mechanical analyzer—Q400-0007.

TABLE 4

Coefficient of thermal expansion of samples 14-18

| Sample | Coefficient of thermal expansion (ppm/° C.) |
|---|---|
| 14 | 5.9 |
| 15 | 6.3 |
| 16 | 4.0 |
| 17 | 4.3 |
| 18 | 4.3 |

The foregoing examples are merely illustrative of some of the features of the invention. The appended claims are intended to claim the invention as broadly as it has been conceived and the examples herein presented are illustrative of selected embodiments from a manifold of all possible embodiments. Accordingly it is Applicants' intention that the appended claims are not to be limited by the choice of examples utilized to illustrate features of the present invention. As used in the claims, the word "comprisies" and its grammatical variants logically also subtend and include phrases of varying and differing extent such as for example, but not limited thereto, "consisting essentially of" and "consisting of." Where necessary, ranges have been supplied, those ranges are inclusive of all sub-ranges there between. It is to be expected that variations in these ranges will suggest themselves to a practitioner having ordinary skill in the art and where not already dedicated to the public, those variations should where possible be construed to be covered by the appended claims. It is also anticipated that advances in science and technology will make equivalents and substitutions possible that are not now contemplated by reason of the imprecision of language and these variations should also be construed where possible to be covered by the appended claims.

The invention claimed is:

1. A coating structure, comprising:
an outer coating comprising aluminum; and
an interlayer disposed between a substrate and the outer coating, and the interlayer comprising one or more of a rare earth metal, a transition metal, or a noble metal; wherein the substrate comprises one or more of a metal nitride, a metal carbide, a metal boride, or a metal oxide, wherein the metal nitride comprises carbon doped boron nitride.

2. A coating structure, comprising:
an outer coating comprising aluminum; and
an interlayer disposed between a substrate and the outer coating, and the interlayer comprising one or more of a rare earth metal, a transition metal, or a noble metal; wherein the substrate comprises one or more of a metal nitride, a metal carbide, a metal boride, or a metal oxide, wherein the metal nitride is pyrolitic boron nitride.

3. The coating structure as defined in claim 1, wherein the metal portion of the metal nitride, the metal carbide, the metal boride, or the metal oxide comprises one or more of tantalum, titanium, tungsten, zirconium, hafnium, lanthanum, vanadium, niobium, magnesium, chromium, molybdenum, or beryllium.

4. The coating structure as defined in claim 1, wherein the outer coating comprises one or more of aluminum nitride, aluminum oxide, or aluminum oxynitride.

5. The coating structure as defined in claim 1, wherein the outer coating has an average thickness in a range of from about 10 Angstroms to about 10 micrometers.

6. The coating structure as defined in claim 1, wherein the rare earth metal comprises cerium or gadolinium.

7. The coating structure as defined in claim 6, wherein the interlayer comprises an oxide of the rare earth metal.

8. The coating structure as defined in claim 1, wherein the transition metal comprises yttrium or hafnium.

9. The coating structure as defined in claim 1, wherein the interlayer comprises an oxide of the transition metal.

10. The coating structure as defined in claim 9, wherein the interlayer consists essentially of hafnium oxide.

11. The coating structure as defined in claim 1, wherein the noble metal comprises one or more of platinum, rhodium, rhenium, or palladium.

12. The coating structure as defined in claim 1, wherein the interlayer is microcrack free.

13. A coating structure, comprising:
an outer coating comprising aluminum; and
an interlayer disposed between a substrate and the outer coating, and the interlayer comprising one or more of a rare earth metal, a transition metal, or a noble metal; wherein the substrate comprises one or more of a metal nitride, a metal carbide, a metal boride, or a metal oxide, wherein the interlayer comprises a silicate glass.

14. The coating structure as defined in claim 13, wherein the silicate glass comprises one or more of calcium, silicon, or boron.

15. The coating structure as defined in claim 13, wherein the rare earth metal is present in the silicate glass in an amount in a range of from about 10 weight percent to about 25 weight percent.

16. The coating structure as defined in claim 13, wherein the rare earth metal is present in the silicate glass in an amount in a range of from about 25 weight percent to about 60 weight percent.

17. The coating structure as defined in claim 1, wherein the interlayer has an average thickness that is greater than about 50 angstroms.

18. The coating structure as defined in claim 1, wherein the interlayer has an average thickness that is less than about 10 micrometers.

19. The coating structure as defined in claim 1, wherein the interlayer has an average thickness in a range of from about 50 Angstroms to about 500 nanometers.

* * * * *